United States Patent
Kim

(10) Patent No.: US 7,271,669 B2
(45) Date of Patent: Sep. 18, 2007

(54) VOLTAGE CONTROLLED OSCILLATOR AND PHASE LOCKED LOOP CIRCUIT HAVING THE SAME

(75) Inventor: Hong Jin Kim, Gyeonggi-do (KR)

(73) Assignee: Hynix Semiconductor Inc., Icheon-Si (KR)

(*) Notice: Subject to any disclaimer, the term of this patent is extended or adjusted under 35 U.S.C. 154(b) by 0 days.

(21) Appl. No.: 10/998,964

(22) Filed: Nov. 30, 2004

(65) Prior Publication Data

US 2005/0146384 A1 Jul. 7, 2005

(30) Foreign Application Priority Data

Jan. 2, 2004 (KR) .................. 10-2004-0000129

(51) Int. Cl.
*H03B 1/00* (2006.01)
(52) U.S. Cl. .................................. 331/57; 327/158
(58) Field of Classification Search ............. 331/57; 327/158
See application file for complete search history.

(56) References Cited

U.S. PATENT DOCUMENTS 4,965,468 A 10/1990 Nicollini et al.
2001/0002115 A1* 5/2001 Hwang et al. .............. 331/17
2003/0119466 A1* 6/2003 Goldman .................... 455/260
2004/0263227 A1* 12/2004 Baker et al. ................ 327/158
2005/0253659 A1* 11/2005 Favrat et al. ................ 331/57

FOREIGN PATENT DOCUMENTS

KR 100244517 B1 11/1999

* cited by examiner

*Primary Examiner*—Joseph Chang
(74) *Attorney, Agent, or Firm*—Townsends & Townsend and Crew LLP

(57) ABSTRACT

A voltage controlled oscillator and a phase locked loop circuit having the same reduce power consumption by using charges leaked into a ground voltage terminal for an output driving operation with characteristics of both output terminals having different phases in a unit delay cell. The voltage controlled oscillator includes a plurality of unit delay cells connected serially. Each unit delay cell comprises a differential amplification unit and an output driving unit. The differential amplification unit compares a plurality of input voltages having different phases and amplifies the comparison result. The output driving unit, which is connected to both output terminals of the differential amplification units, drives an output voltage of another output terminal with a potential of one of both output terminals.

9 Claims, 4 Drawing Sheets

VOLTAGE CONTROLLED OSCILLATOR AND PHASE LOCKED LOOP CIRCUIT HAVING THE SAME

BACKGROUND ART

1. Field of the Invention

The present invention generally relates to a voltage controlled oscillator and a phase locked loop circuit having the same, and more specifically, to a technology of reducing power consumption by using charges leaked into a ground voltage terminal for an output driving operation with characteristics of both output terminals having different phases in a unit delay cell.

2. Description of the Prior Art

Generally, a voltage controlled oscillator is a circuit to obtain a desired output frequency by regulating a voltage.

FIG. 1 is a circuit diagram illustrating a unit delay cell of a conventional voltage controlled oscillator.

The unit delay cell of the conventional voltage controlled oscillator comprises PMOS transistors PM1 and PM2, and NMOS transistors NM1~NM3.

The NMOS transistors NM1 and NM2 are controlled by differential input voltages VIN, and VINB, respectively. When the input voltage VIN is larger than the input voltage VINB, the NMOS transistor NM1 is turned on stronger than the NMOS NM2.

In the above-described unit delay cell having a differential structure, since output voltages VOUT and VOUTB of both output terminals are outputted only depending on a power voltage VDD, power consumption becomes larger, and the output voltages VOUT and VOUTB become unstable when the level of the power voltage VDD becomes lower.

As a result, in the voltage controlled oscillator with the above-described unit delay cell, the power consumption becomes larger, so that noise is easily generated due to power shortage.

SUMMARY OF THE INVENTION

Accordingly, it is an object of the present invention to reduce power consumption and prevent noise by stably driving each output signal with charges leaked into a ground voltage terminal of both output terminals of a unit delay cell of a differential-structured voltage controlled oscillator even when a power voltage becomes lower.

It is another object of the present invention to provide a phase locked loop circuit having the above-described voltage controlled oscillator.

In an embodiment, a voltage controlled oscillator includes a plurality of unit delay cells connected serially. Each unit delay cell comprises a differential amplification unit and an output driving unit. The differential amplification unit compares a plurality of input voltages having different phases and amplifies the comparison result. The output driving unit, which is connected to both output terminals of the differential amplification units, drives a different output terminal with a potential of one of both output terminals.

In an embodiment, a phase locked loop circuit comprises a phase comparing unit, a charge pump, and a voltage controlled oscillator. The phase comparing unit compares a phase difference between input frequency and output frequency to output a signal depending on the phase difference. The charge pump receives an output signal from the phase comparing unit to pump charges. The voltage controlled oscillator comprising a plurality of unit delay cells receives an output signal from the charge pump to regulate the frequency and outputting a desired frequency. Here, wherein the unit delay cell comprises a differential amplification unit for comparing the plurality of input voltages having different phases and amplifying the comparison result, and an output driving unit, connected to both output terminals of the differential amplification units, for driving an output voltage of another output terminal with a potential of the other output terminal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
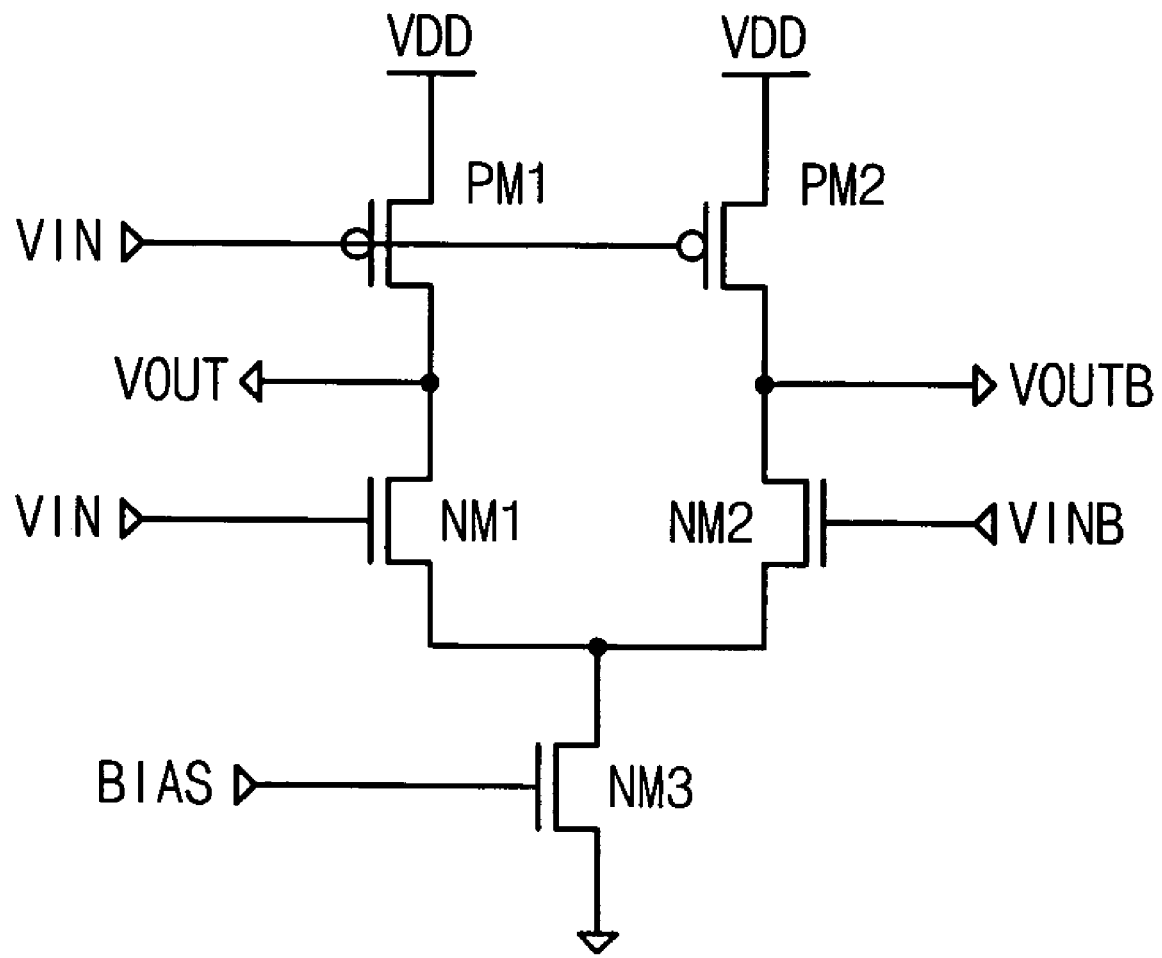
FIG. 1 is a circuit diagram illustrating a conventional unit delay cell.
Figure 2:
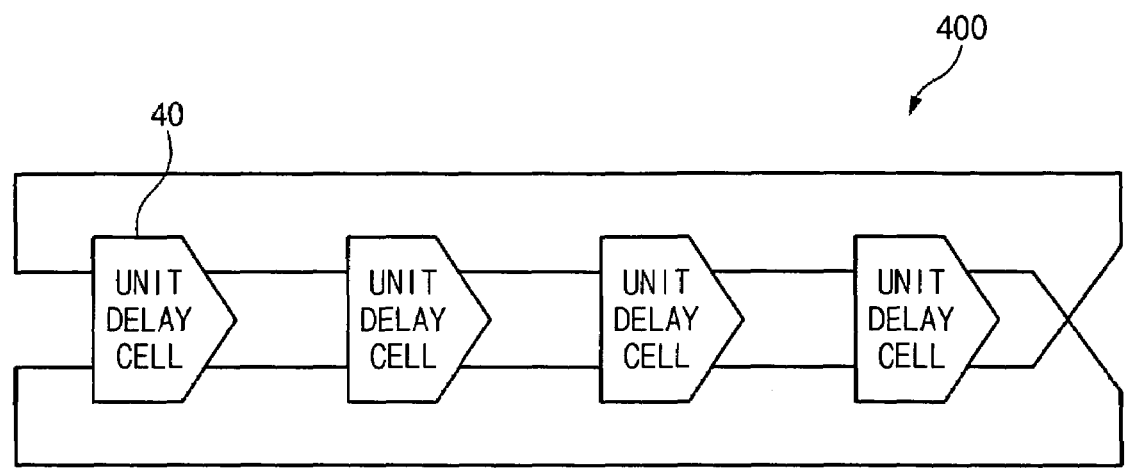
FIG. 2 is a diagram illustrating a voltage controlled oscillator according to an embodiment of the present invention.

FIG. 2 is a diagram illustrating a voltage controlled oscillator according to an embodiment of the present invention.

The voltage controlled oscillator 400 includes a plurality of unit delay cells 40 connected serially, where an output terminal of the final unit delay cell is connected to an input terminal of the first unit delay cell. This structure is a feed-back structure. Here, since noise characteristics are degraded as the number of the unit delay cells 40 becomes larger, 4 unit delay cells 40 are comprised in the embodiment of FIG. 2.

Figure 3:
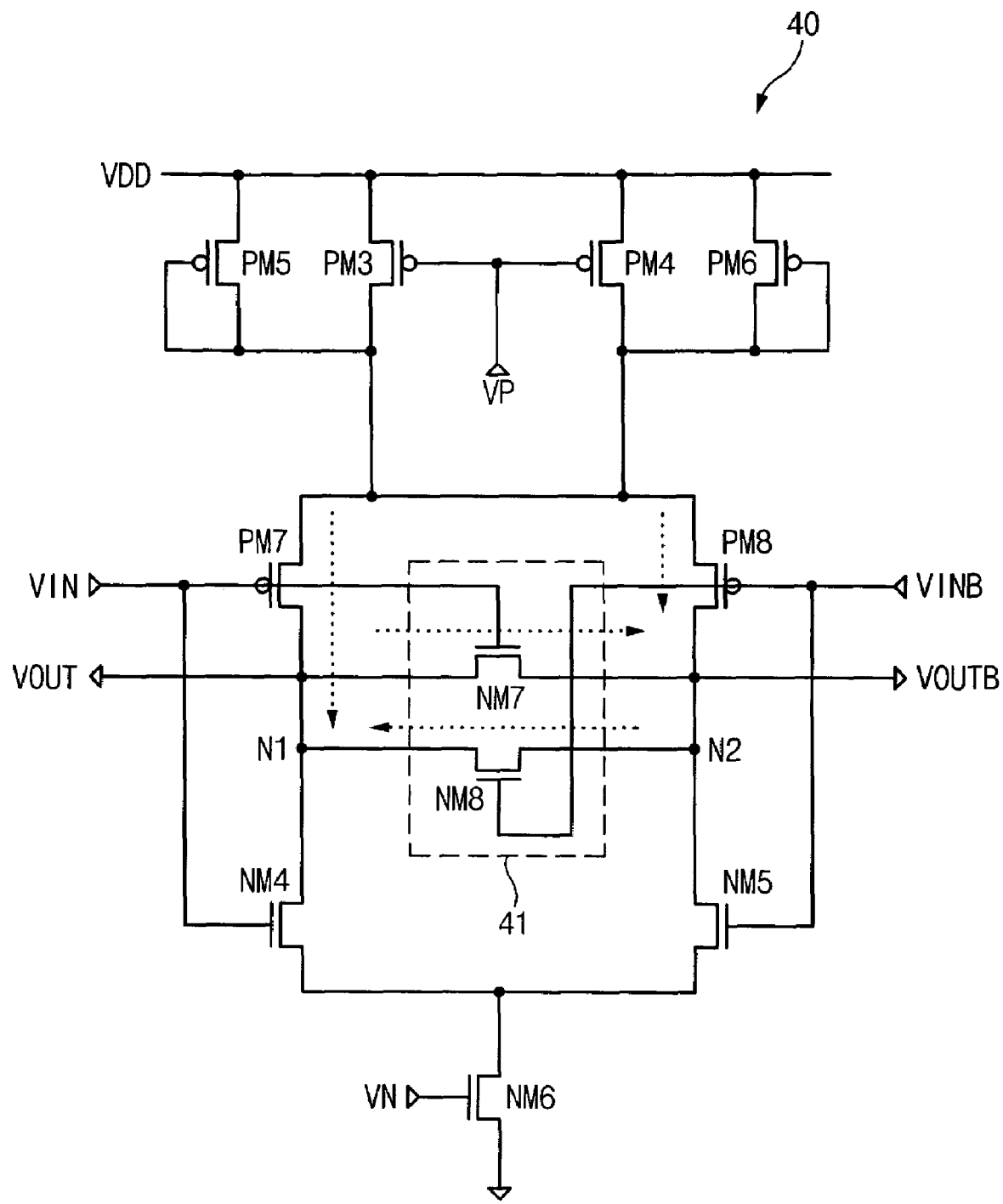
FIG. 3 is a circuit diagram illustrating a unit delay cell of FIG. 2.

FIG. 3 is a circuit diagram illustrating the unit delay cell 40 of FIG. 2.

The unit delay cell 40 comprises PMOS transistors PM3~PM8 and NMOS transistors NM4~NM6 which form a differential amplification structure, and an output driving unit 41 connected to both output terminals of the differential amplification structure.

The PMOS transistors PM3~PM8 and the NMOS transistors NM4~NM6 compare two input voltages VIN, VINB having different phases and amplify the comparison result.

The PMOS transistors PM3~PM6 lowers a power voltage VDD, which serve as a load unit for applying the dropped power voltage VDD to a source of the PMOS transistors PM7 and PM8. The NMOS transistor NM6, controlled by a voltage control signal VN, has a drain connected to a source of the NMOS transistors NM4 and NM5, and a source connected to a ground voltage VSS terminal.

The NMOS transistor NM4 and the PMOS transistor PM7, which are connected serially between a drain of the PMOS transistors PM3~PM6 and a drain of the NMOS transistor NM6, determines a potential of a node N1 in response to the input voltage VIN.

The NMOS transistor NM5 and the PMOS transistor PM8, which are connected serially between a drain of the PMOS transistors PM3~PM6 and a drain of the NMOS transistor NM6, determines a potential of a node N2 in response to the input voltage VINB.

The output driving unit 41 comprises NMOS transistors NM7 and NM8 whose drain and source are connected to both output terminal of the differential amplification structure.

When an output voltage VOUTB is outputted in response to the input voltage VIN, the NMOS transistor NM7 flows charges in the node N1 into the node N2 to maintain the output voltage VOUTB although the level of the power voltage VDD becomes lower. Meanwhile, the NMOS transistor NM8, which is controlled by the input voltage VINB, flows charges in the node N2 into the node N1 to maintain the level of the output voltage VOUT although the level of the power voltage VDD becomes lower.

Accordingly, the unit delay cell 40 according to an embodiment of the present invention maintains an output driving power of the other output terminal not only with the power voltage VDD but also with charges of the opposite output terminal in both output terminals, so that the unit delay cell 40 provides the stable output voltages VOUT and VOUTB although the power voltage VDD becomes lower.

Hereinafter, the operation of the unit delay cell 40 is described.

When the input voltage VIN which is inputted into one input terminal of the differential amplification structure is relatively larger than the input voltage VINB another input terminal of the differential amplification, the NMOS transistor NM4 is turned on stronger than the NMOS transistor NM5, and the PMOS transistor PM8 is turned on stronger than the PMOS transistor PM7. Here, the NMOS transistors NM7 and NM8 are turned off.

When the input voltage VIN transits from 'high' to 'low', the output voltage VOUT transits from 'low' to 'high'. As a result, when the input voltage VINB transits from 'low' to 'high', the NMOS transistor NM8 is turned on, so that charges of the node N2 of the output voltage VOUTB terminal are provided to the node N1 to help the output driving operation of the output voltage VOUT.

Since the output voltage VOUT of the unit delay cell 40 uses the charges provided from the node N2 of the opposite output terminal, the output voltage VOUT can be driven with the small amount of charges provided from the power voltage VDD line, thereby reducing power consumption.

On the other hand, when the input voltage VIN is relatively smaller than the input voltage VINB, the NMOS transistor NM5 is turned on stronger than the NMOS transistor NM4, and the PMOS transistor PM7 is turned on stronger than the PMOS transistor PM8. Here, the NMOS transistors NM7 and NM8 are turned off.

When the input voltage VIN transits from 'low' to 'high', the NMOS transistor NM7 is turned on, so that the charges of the node N1 are provided to the node N2. Since the output voltage VOUTB is driven from 'low' to 'high' with the charges provided from the node N1, the output voltage VOUTB can be driven from 'low' to 'high' with the small amount of charges provided from the power voltage VDD line, thereby reducing power consumption.

Therefore, the power consumption of the voltage controlled oscillator can be reduced by a plurality of the improved unit delay cells.

Figure 4:
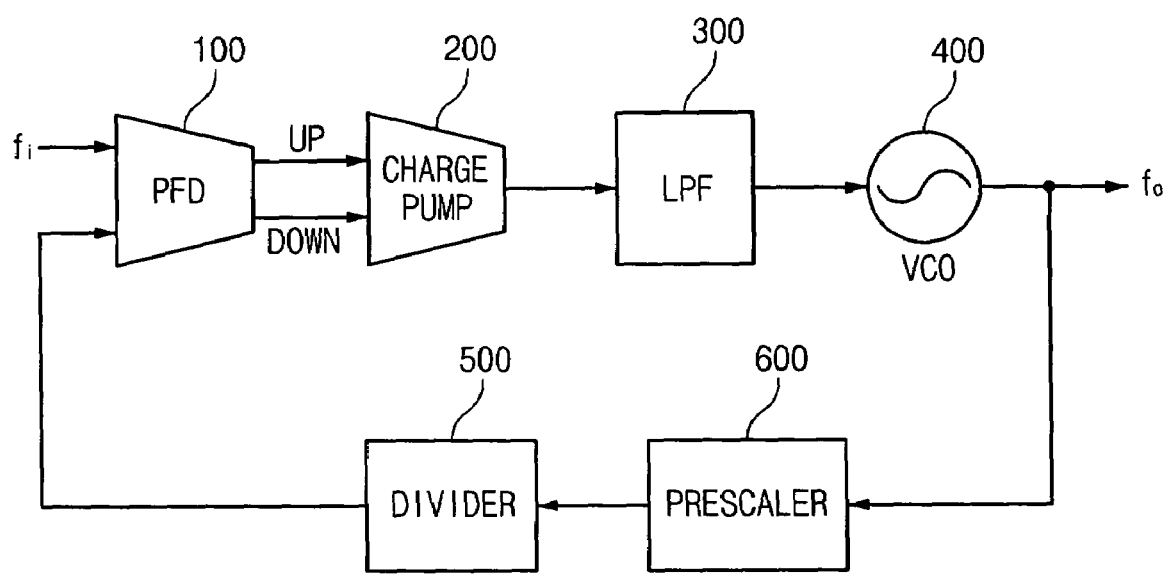
FIG. 4 is a block diagram illustrating a phase locked loop circuit having the voltage controlled oscillator of FIG. 2.

FIG. 4 is a block diagram illustrating a phase locked loop circuit having the voltage controlled oscillator of FIG. 2. In an embodiment, a phase locked loop circuit (hereinafter, abbreviated as "PLL") comprises a phase frequency detector 100 (hereinafter, abbreviated as "PFD"), a charge pump 200, a low pass filter 300 (hereinafter, abbreviated as "LPF"), a voltage controlled oscillator 400 (hereinafter, abbreviated as "VCO"), a divider 500 and a prescaler 600.

The PFD 100 compares an input frequency signal $f_i$ with a phase difference of an output frequency signal $f_o$ outputted from the VCO 400, and generates an up signal UP and a down signal DOWN in response to the comparison result. The charge pump 200 receives the up signal UP and the down signal DOWN from the PFD 100, and outputs a control signal for controlling the VCO 400.

The LPF 300 filters a signal received from the charge pump 200. The VCO 400 controls a voltage of a signal received from the LPF 300 to control an output frequency signal $f_o$. The divider 500 and the prescaler 600 divide the output frequency signal $f_o$.

The above-described voltage controlled oscillator can be applied to a jitter removal circuit and a clock recovery circuit as well as to the PLL.

As discussed earlier, a voltage controlled oscillator and a phase locked loop circuit having the same according to an embodiment of the present invention reduce power consumption and prevent noise by stably driving output voltages with charges of another output terminals although a power voltage level becomes lower when one of both output terminals in a unit delay cell having a differential amplification structure is driven.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A voltage controlled oscillator including a plurality of unit delay cells connected serially, each unit delay cell comprising:

a differential amplification unit for comparing a plurality of input voltages having different phases and amplifying the comparison result; and an output driving unit, connected to both output terminals of the differential amplification units, for driving an output voltage of another output terminal with a potential of one of both output terminals, wherein the output driving unit comprises:

a first NMOS transistor for driving an output voltage of a second output terminal of both output terminals with a charge of a first output terminal of both output terminals, connected to both output terminals of the differential amplification units, a gate to receive a first input voltage; and a second NMOS transistor for driving an output voltage of the first output terminal with a charge of the second output terminal, connected to both output terminals of the differential amplification units, and a gate to receive a second input voltage.

2. The voltage controlled oscillator according 1, wherein the differential amplification unit comprises: third and fourth NMOS transistors and first and second PMOS transistors which receive the plurality of input voltages and are switched in response to a difference in the plurality of input voltages;

a current source unit, connected between a ground voltage terminal and a source of the third and fourth NMOS transistors, for controlling the total amount of current flowing in the third and fourth NMOS transistors in response to an externally inputted voltage control signal; and a load unit, connected between a power voltage terminal and a source of the first and second PMOS transistors.

3. The voltage controlled oscillator according to claim 1, wherein the unit delay cell is formed of the even number of cells.

4. The voltage controlled oscillator according to claim 1, wherein the voltage controlled oscillator is a ring-type.

5. A phase locked loop circuit comprising:
a phase comparing unit for comparing a phase difference between input frequency and output frequency to output a signal depending on the phase difference;
a charge pump for receiving an output signal from the phase comparing unit to pump charges; and
a voltage controlled oscillator comprising a plurality of unit delay cells for receiving an output signal from the charge pump to regulate the frequency and outputting a desired frequency,
wherein the unit delay cell comprises:
a differential amplification unit for comparing the plurality of input voltages having different phases and amplifying the comparison result; and
an output driving unit, connected to both output terminals of the differential amplification units, for driving an output voltage of another output terminal with a potential of the other output terminal,
wherein the output driving unit comprises:
a first NMOS transistor for driving an output voltage of a second output terminal of both output terminals with a charge of a first output terminal of both output terminals, connected to both output terminals of the differential amplification units, a gate to receive a first input voltage; and
a second NMOS transistor for driving an output voltage of the first output terminal with a charge of the second output terminal, connected to both output terminals of the differential amplification units, and a gate to receive a second input voltage.

6. The phase locked loop circuit according to claim 5, wherein the differential amplification unit comprises:
third and fourth NMOS transistors and first and second PMOS transistors which receive the plurality of input voltages and are switched in response to a difference in the plurality of input voltages;
a current source unit, connected between a ground voltage terminal and a source of the third and fourth NMOS transistors, for controlling the total amount of current flowing in the third and fourth NMOS transistors in response to an externally inputted voltage control signal; and
a load unit, connected between a power voltage terminal and a source of the first and second PMOS transistors.

7. The phase locked loop circuit according to claim 5, wherein the unit delay cell is formed of the even number of cells.

8. The phase locked loop circuit according to claim 5, wherein the voltage controlled oscillator is a ring-type.

9. The phase locked loop circuit according to claim 5, further comprising:
a low frequency filter for filtering an output signal from the charge pump; and
a prescaler and a divider which divide an output frequency from the voltage controlled oscillator.

* * * * *